United States Patent
Ihara et al.

(10) Patent No.: US 10,264,684 B2
(45) Date of Patent: Apr. 16, 2019

(54) CONDUCTIVITY INSPECTION METHOD OF PRINTED CIRCUIT BOARD AND MANUFACTURING METHOD OF PRINTED CIRCUIT BOARD

(71) Applicant: Nitto Denko Corporation, Osaka (JP)

(72) Inventors: Terukazu Ihara, Ibaraki (JP); Kouji Ichinose, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 131 days.

(21) Appl. No.: 14/477,178

(22) Filed: Sep. 4, 2014

(65) Prior Publication Data
US 2015/0059162 A1    Mar. 5, 2015

(30) Foreign Application Priority Data

Sep. 5, 2013    (JP) .................... 2013-183768

(51) Int. Cl.
*H05K 3/40* (2006.01)
*G01R 31/28* (2006.01)
(Continued)

(52) U.S. Cl.
CPC ....... *H05K 3/4038* (2013.01); *G01R 31/2805* (2013.01); *G01R 31/2813* (2013.01);
(Continued)

(58) Field of Classification Search
CPC .... G01R 31/2812; G01R 27/08; G01R 1/073; H05K 3/10; H05K 3/4038; H05K 1/115;
(Continued)

(56) References Cited

U.S. PATENT DOCUMENTS

2007/0007975 A1* 1/2007 Hawkins ............. G01R 27/26
  324/724
2010/0116540 A1  5/2010 Ishii et al.
(Continued)

FOREIGN PATENT DOCUMENTS

JP    S62282277 A    12/1987
JP    2005-337811 A    12/2005
(Continued)

OTHER PUBLICATIONS

Office Action dated Mar. 21, 2017 in JP Application No. 2013-183768.
(Continued)

*Primary Examiner* — Peter DungBa Vo
*Assistant Examiner* — Azm Parvez
(74) *Attorney, Agent, or Firm* — Panitch Schwarze Belisario & Nadel LLP (57) ABSTRACT

First and second measurement probes come into contact with first and second electrode pads, respectively, and third and fourth measurement probes come into contact with the first and second electrode pads, respectively. A current flows in a current path including the first and second electrode pads and a plurality of lines through the first and second measurement probes. A value of the current in the current path is measured, and a value of a voltage between the third and fourth measurement probes is measured. Conductivity between the first and second electrode pads is inspected based on the measured value of the current and the measured value of the voltage.

3 Claims, 9 Drawing Sheets

(51) Int. Cl.
| | | |
|---|---|---|
| *G11B 5/455* | (2006.01) | |
| *H05K 1/02* | (2006.01) | |
| *G11B 5/48* | (2006.01) | |
| *H05K 1/11* | (2006.01) | |
| *H05K 3/46* | (2006.01) | |

(52) U.S. Cl.
CPC ........... *G11B 5/455* (2013.01); *H05K 1/0268* (2013.01); *G11B 5/484* (2013.01); *H05K 1/115* (2013.01); *H05K 1/116* (2013.01); *H05K 3/4685* (2013.01); *H05K 2201/0939* (2013.01); *H05K 2201/09381* (2013.01); *Y10T 29/49004* (2015.01)

(58) Field of Classification Search
CPC ......... H05K 1/116; H05K 2201/09381; H05K 2201/0939; Y10T 29/49004
USPC .............................. 29/593, 592.1; 701/763.01
See application file for complete search history.

(56) References Cited

U.S. PATENT DOCUMENTS

| | | | | |
|---|---|---|---|---|
| 2012/0326712 A1* | 12/2012 | Tudosa | ................ | G01R 33/093 324/252 |
| 2013/0093441 A1* | 4/2013 | Tonini | .................... | H01L 22/14 324/693 |

FOREIGN PATENT DOCUMENTS

| | | | | | |
|---|---|---|---|---|---|
| JP | 2005337811 A | * | 12/2005 | | |
| JP | 200974963 A | | 4/2009 | | |
| JP | 2010-135754 A | | 6/2010 | | |
| JP | 201357597 A | | 3/2013 | | |
| JP | 2013057597 A | * | 3/2013 | ........... | G01R 31/026 |
| JP | WO 2013035357 A1 | * | 3/2013 | ........... | G01R 31/026 |

OTHER PUBLICATIONS

Office Action dated Oct. 31, 2017 in JP Application No. 2013183768.
'Productization of "Narrow-Pitch Kelvin Inspection Probe' for Analog IC Inspection," Yokow Co., Ltd., Jul. 30, 2012, Internet<URL:http://www.vokowo.co.jp/release/pdf/12_07_03.pdf>, 2 pages.
Office Action dated Feb. 24, 2018 in CN 201410454097.3.
Office Action dated Aug. 30, 2018 in Chinese Application No. 201410454097.3.
Dangqiang, University Physics Experiment, China Electric Power Press Co., Ltd., pp. 103-104, Feb. 2009. (concise explanation of relevance provided in English translation of Office Action dated Aug. 30, 2018 in Chinese Application No. 201410454097.3 at pp. 1, 3).
Morris, Electrical and Electronic Principles, Higher Education Press Co., Ltd., Dec. 1996 (concise explanation of relevance provided in English translation of Decision of Refusal, cited herewith).
Office Action dated Dec. 12, 2018 in CN Application No. 201410454097.3.

* cited by examiner

CONDUCTIVITY INSPECTION METHOD OF PRINTED CIRCUIT BOARD AND MANUFACTURING METHOD OF PRINTED CIRCUIT BOARD

BACKGROUND OF THE INVENTION

Field of the Invention

The present invention relates to a conductivity inspection method of a printed circuit board, and a manufacturing method of the printed circuit board.

Description of Related Art

Actuators are used in drive devices such as hard disc drive devices. Such an actuator includes an arm provided rotatably around a rotation shaft, and a suspension board with a circuit for a magnetic head that is attached to the arm. The suspension board with a circuit is a printed circuit board for positioning the magnetic head at a desired track of a magnetic disc.

In a printed circuit board in JP 2010-135754 A, first to fourth electrode pads are formed on one surface of an insulating layer. The first electrode pad and the second electrode pad are electrically connected by a first wiring trace, and the third electrode pad and the fourth electrode pad are electrically connected by a second wiring trace.

In the first wiring trace, a first line connected to the first electrode pad branches into second and third lines. The second and third lines join as a fourth line, and the fourth line is connected to the second electrode pad. In the second wiring trace, a fifth line connected to the third electrode pad branches into sixth and seventh lines. The sixth and seventh lines join as an eighth line, and the eighth line is connected to the fourth electrode pad.

Here, the second, sixth, third and seventh lines are arranged to line up in this order. A portion of the third line intersecting with the sixth line is arranged on the other surface of the insulating layer in order to avoid interference of the third line with the sixth line. The portion of the third line arranged on the other surface of the insulating layer is electrically connected to the third line arranged on the one surface of the insulating layer through a pair of first vias. Similarly, a portion of the sixth line intersecting with the third line is arranged on the other surface of the insulating layer. The portion of the sixth line arranged on the other surface of the insulating layer is electrically connected to the sixth line arranged on the one surface of the insulating layer through a pair of second vias.

BRIEF SUMMARY OF THE INVENTION

In a manufacturing process of a printed circuit board, whether the printed circuit board is proper or improper is determined by a conductivity inspection for an area between electrode pads (JP 2005-337811 A, for example).

In the printed circuit board described in JP 2010-135754 A, however, even when there is an abnormality in the first via, or even when the branched second or third line is disconnected, an area between the first and second electrode pads is rendered conductive. Similarly, even when there is an abnormality in the second via, or even when the branched sixth or seventh line is disconnected, an area between the third and fourth electrode pads is rendered conductive. Therefore, even when the printed circuit board described in JP 2010-135754 A is inspected by a conductivity inspection method described in JP 2005-337811 A, it may not be possible to detect an abnormality in conductivity between the electrode pads.

An object of the present invention is to provide a conductivity inspection method of a printed circuit board that can detect an abnormality in conductivity between electrode pads even when the electrode pads are electrically connected by a plurality of lines, and a manufacturing method of the printed circuit board.

(1) According to one aspect of the present invention, a conductivity inspection method of a printed circuit board in which first and second electrode pads are electrically connected to each other by a plurality of lines, includes the steps of bringing first and second measurement probes into contact with the first and second electrode pads, respectively, and bringing third and fourth measurement probes into contact with the first and second electrode pads, respectively, forming a current path such that a current flows in the first and second electrode pads and the plurality of lines through the first and second measurement probes, measuring a value of the current in the current path, measuring a value of a voltage between the third and fourth measurement probes, and inspecting conductivity between the first and second electrode pads based on the measured value of the current and the measured value of the voltage.

This conductivity inspection method of the printed circuit board causes the first and second measurement probes to come into contact with the first and second electrode pads, respectively, and the third and fourth measurement probes to come into contact with the first and second electrode pads, respectively. In this state, the current flows in the current path including the first and second electrode pads and the plurality of lines through the first and second measurement probes.

The value of the current in the current path is measured, and the value of the voltage between the third and fourth measurement probes is measured. In this case, the current does not flow in the third and fourth measurement probes. Therefore, the value of the voltage between the third and fourth measurement probes is not affected by contact resistance. Thus, the value of the voltage between the third and fourth measurement probes can be measured with high accuracy and high repeatability.

Conductivity between the first and second electrode pads is inspected based on the measured value of the current and the measured value of the voltage. Here, the value of the voltage is measured with high accuracy and high repeatability, so that it is possible to distinguish between a conductive state obtained when the plurality of lines are normal, and a conductive state obtained when any one of the plurality of lines is abnormal. As a result, even when the first and second electrode pads are electrically connected by the plurality of lines, an abnormality in conductivity between the electrode pads can be detected.

(2) Each of diameters of the first and third measurement probes may be not less than 20 μm and not more than 50 μm.

This configuration enables the first and third measurement probes to be easily brought into contact with the first electrode pad with the first and third measurement probes not being brought into contact with each other even when a dimension of the first electrode pad is relatively small.

(3) The step of bringing the first and second measurement probes into contact with the first and second electrode pads, respectively, and bringing the third and fourth measurement probes into contact with the first and second electrode pads, respectively, may include bringing the first and third measurement probes into contact with the first electrode pad such that a distance between centers of the first and third measurement probes is not less than 30 μm and not more than 150 μm.

In this case, the distance between the first and third measurement probes can be sufficiently maintained with the first and third measurement probes being in contact with the first electrode pad. Thus, it is possible to measure, with high accuracy and high repeatability, the value of the voltage between the third and fourth measurement probes without effect of the contact resistance.

(4) The step of inspecting the conductivity between the first and second electrode pads may include calculating a ratio of the measured value of the current to the measured value of the voltage, and comparing the calculated ratio to a predetermined threshold value, and determining whether or not conductivity in the plurality of lines between the first and second electrode pads in the printed circuit board is abnormal based on a result of comparison.

In this case, whether or not the conductivity in the plurality of lines is abnormal can be easily determined based on the result of comparison between the calculated ratio and the threshold value.

(5) The plurality of lines may be formed to branch from a single line connected to the first electrode pad and to join a single line connected to the second electrode pad.

In this case, electrically connecting the first and second electrode pads to each other by the plurality of lines becomes easier.

(6) A via may be inserted into at least one of the plurality of lines.

In this case, it is possible to arrange the plurality of lines on the printed circuit board using design having a high degree of freedom by inserting the via. Here, when there is an abnormality in the via, a conductive state between the first and second electrode pads changes. The above-mentioned conductivity inspection method of the printed circuit board enables the conductive state between the first and second electrode pads obtained when the via is normal, and the conductive state between the first and second electrode pads obtained when the via is abnormal to be distinguished. Thus, even when the via is inserted into at least one of the plurality of lines, an abnormality in conductivity between the electrode pads can be detected.

(7) According to another aspect of the present invention, a manufacturing method of a printed circuit board includes the steps of forming first and second electrode pads on one surface or another surface of an insulating layer, and forming a plurality of lines that electrically connect the first and second electrode pads on the one surface of the insulating layer, and inspecting conductivity between the first and second electrode pads by the conductivity inspection method of the printed circuit board according to one aspect of the present invention.

This manufacturing method of the printed circuit board causes the first and second electrode pads to be formed on the one surface or the other surface of the insulating layer, and the plurality of lines that electrically connect the first and the second electrode pads to be formed on the one surface of the insulating layer. The conductivity between the first and second electrode pads is inspected by the above-mentioned conductivity inspection method of the printed circuit board.

In this case, because the value of the voltage is measured with high accuracy and high repeatability, it is possible to distinguish between the conductive state obtained when the plurality of lines are normal, and the conductive state obtained when any one of the plurality of lines is abnormal. Thus, even when the first and second electrode pads are electrically connected by the plurality of lines, an abnormality in conductivity between the electrode pads can be detected.

(8) The step of forming the plurality of lines may include forming a connection layer on the other surface of the insulating layer, forming first and second through holes in the insulating layer, electrically connecting a first line to the first electrode pad, electrically connecting a second line to the second electrode pad, electrically connecting a third line to the first line, and electrically connecting the third line to the connection layer through the first through hole, electrically connecting a fourth line to the first and second lines, and electrically connecting a fifth line to the second line, and electrically connecting the fifth line to the connection layer through the second through hole.

In this case, the vias are formed in the first and second through holes, respectively. Thus, a portion of the line can be arranged on the other surface of the insulating layer with simple configuration. As a result, the plurality of lines can be arranged on the printed circuit board using design having a higher degree of freedom.

Here, when there is an abnormality in the via, the conductive state between the first and second electrode pads changes. The above-mentioned conductivity inspection method of the printed circuit board enables the conductive state between the first and second electrode pads obtained when the vias are normal, and the conductive state between the first and second electrode pads obtained when the via is abnormal to be distinguished. Thus, even when the via is inserted into at least one of the plurality of lines, an abnormality in conductivity between the electrode pads can be detected.

(9) Forming the connection layer may include forming a metal layer on the other surface of the insulating layer, and electrically insulating a portion of the metal layer from other portions of the metal layer as the connection layer by processing the metal layer.

In this case, the printed circuit board can be used as the suspension board with a circuit. Further, the connection layer is made of the portion of the metal layer, so that the connection layer and the other portions of the metal layer can be formed in the common manufacturing step. Thus, it is possible to improve productivity without complicating the manufacturing step.

(10) A maximum dimension of the first electrode pad in a first direction may be not less than 20 μm and not more than 100 μm, and a maximum dimension of the first electrode pad in a second direction perpendicular to the first direction may be not less than 40 μm and not more than 200 μm.

In this case, it is possible to easily bring the first and third measurement probes into contact with the first electrode pad without bringing the first and third measurement probes into contact with each other while an increase in size of the first electrode pad is avoided.

Other features, elements, characteristics, and advantages of the present invention will become more apparent from the following description of preferred embodiments of the present invention with reference to the attached drawings.

DESCRIPTION OF THE PREFERRED EMBODIMENTS

A conductivity inspection method and a manufacturing method of a printed circuit board according to one embodiment of the present invention will be described below with reference to drawings. The configuration of a suspension board used for an actuator in a hard disc drive device as the printed circuit board that is inspected by the conductivity inspection method according to the one embodiment of the present invention and its manufacturing method will be described below.

(1) Configuration of Suspension Board

Figure 1:
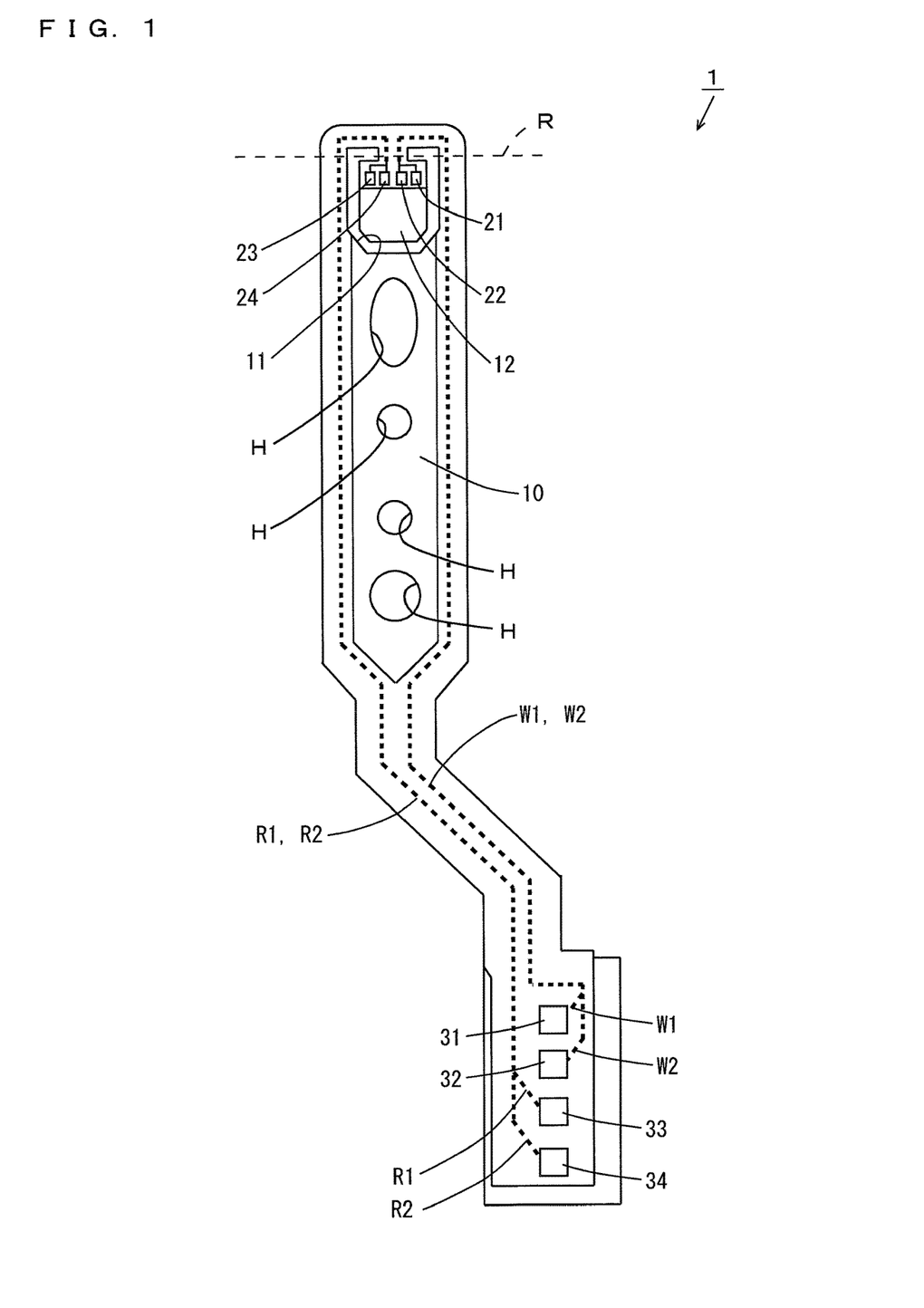
FIG. 1 is a top view of a suspension board that is inspected by a conductivity inspection method according to one embodiment of the present invention.

FIG. 1 is a top view of the suspension board that is inspected by the conductivity inspection method according to the one embodiment of the present invention. As shown in FIG. 1, the suspension board 1 includes a suspension body 10 formed of a long-sized metal substrate. Write wiring traces W1, W2 and read wiring traces R1, R2 are formed on the suspension body 10 as indicated by thick dotted lines. The write wiring trace W1 and the write wiring trace W2 constitute a signal line pair. Further, the read wiring trace R1 and the read wiring trace R2 constitute a signal line pair.

A magnetic head supporting portion (hereinafter referred to as a tongue) 12 is provided by forming a U-shaped opening 11 at the tip end of the suspension body 10. The tongue 12 is bent along a broken line R to form a predetermined angle with the suspension body 100. Four electrode pads 21, 22, 23, 24 are formed at the end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected by the write wiring traces W1, W2 and the read wiring traces R1, R2, respectively. Further, a plurality of holes H are formed in the suspension body 10.

In the hard disc drive device (not shown) including the suspension board 1, a current flows in the pair of write wiring traces W1, W2 at the time of writing information into a magnetic disc. Further, a current flows in the pair of read wiring traces R1, R2 at the time of reading information from the magnetic disc.

(2) Write Wiring Traces

Figure 2:
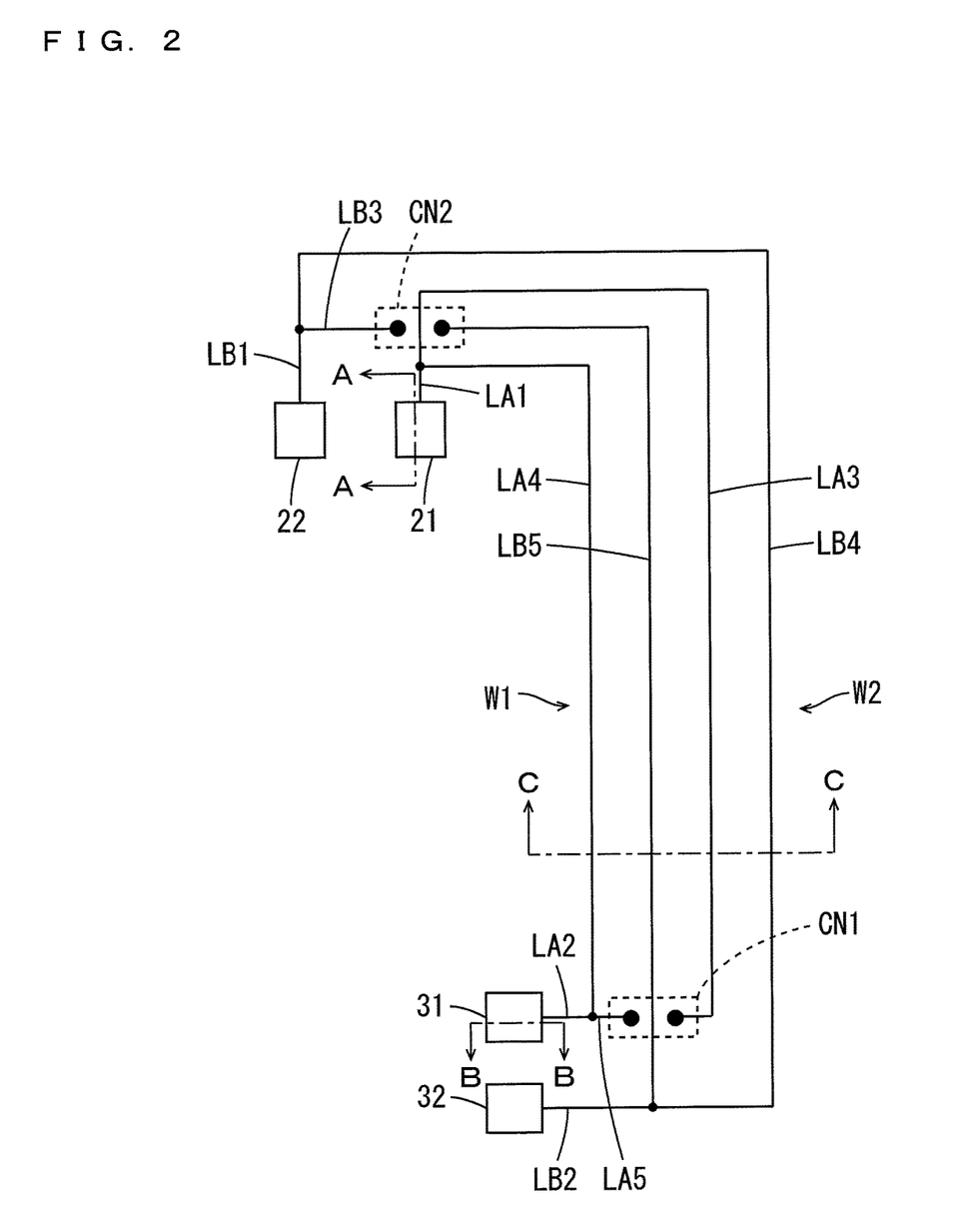
FIG. 2 is a schematic diagram showing the configuration of write wiring traces.

Next, the detailed configuration of the write wiring traces W1, W2 will be described. FIG. 2 is a schematic diagram showing the configuration of the write wiring traces W1, W2. As shown in FIG. 2, the write wiring trace W1 is constituted by lines LA1 to LA5. The line LA1 is connected to the electrode pad 21, and the line LA2 is connected to the electrode pad 31.

One end of the line LA3 and one end of the line LA4 are integrated into the line LA1. The other end of the line LA3 and the one end of the line LA5 are electrically connected in an intersection region CN1. Details of the intersection region CN1 will be described below. The other end of the line LA4 and the other end of the line LA5 are integrated into the line LA2.

The write wiring trace W2 is constituted by lines LB1 to LB5. The line LB1 is connected to the electrode pad 22, and the line LB2 is connected to the electrode pad 32.

One end of the line LB3 and one end of the line LB4 are integrated into the line LB1. The other end of the line LB3 and one end of the line LB5 are electrically connected in an intersection region CN2. Details of the intersection region CN2 will be described below. The other end of the line LB4 and the other end of the line LB5 are integrated into the line LB2.

The lines LA3, LA4 of the write wiring trace W1 and the lines LB4, LB5 of the write wiring trace W2 are alternately arranged in parallel with each other. The line LA3 of the write wiring trace W1 extends to pass through a portion between the end of the line LB3 and the end of the line LB5 of the write wiring trace W2 in the intersection region CN2, and the line LB5 of the write wiring trace W2 extends to pass through a portion between the end of the line LA3 and the end of the line LA5 of the write wiring trace W1 in the intersection region CN1.

Figure 3:
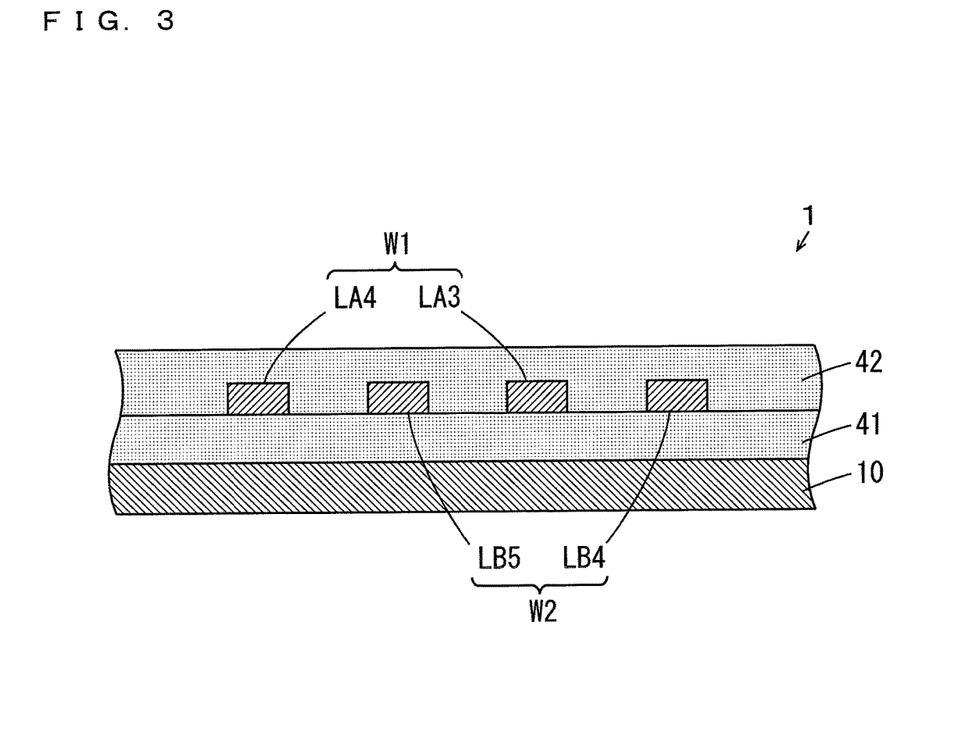
FIG. 3 is a schematic cross sectional view of lines of the write wiring traces and their peripheral portions.

FIG. 3 is a schematic cross sectional view of the lines LA3, LA4, LB4, LB5 of the write wiring traces W1, W2 and their peripheral portions. FIG. 3 is equivalent to a cross sectional view taken along a line C-C of FIG. 2.

As shown in FIG. 3, a base insulating layer 41 is formed on the suspension body 10. The lines LA3, LA4, LB4, LB5 of the write wiring traces W1, W2 are formed on the base insulating layer 41. A cover insulating layer 42 is formed on the base insulating layer 41 to cover the write wiring traces W1, W2.

Figure 4A:
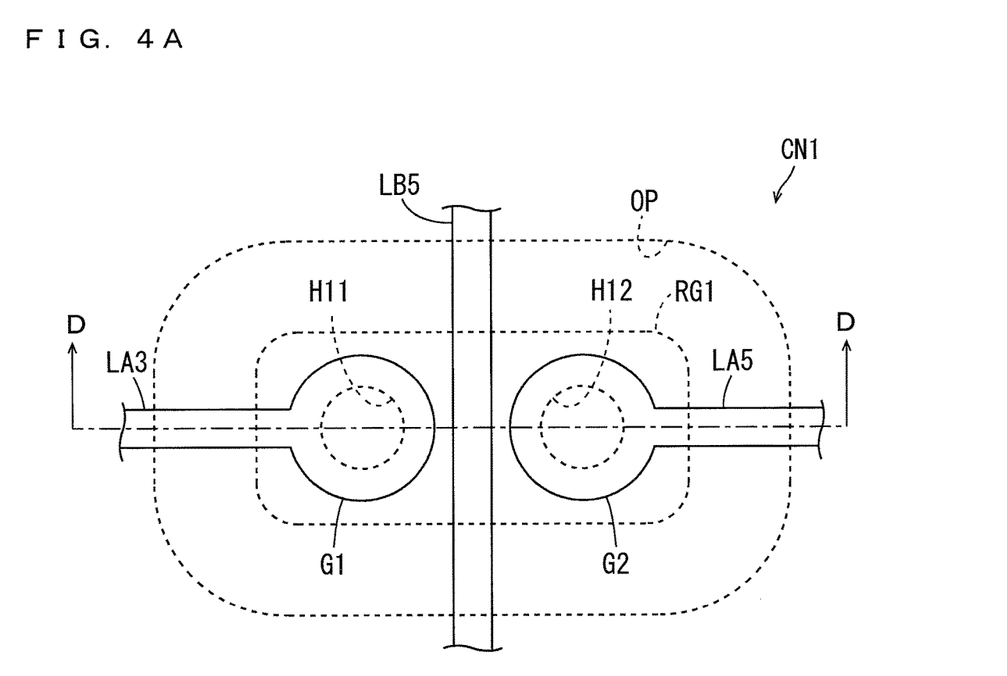
FIGS. 4A and 4B are diagrams showing the details of an intersection region of FIG. 2.
Figure 4B:
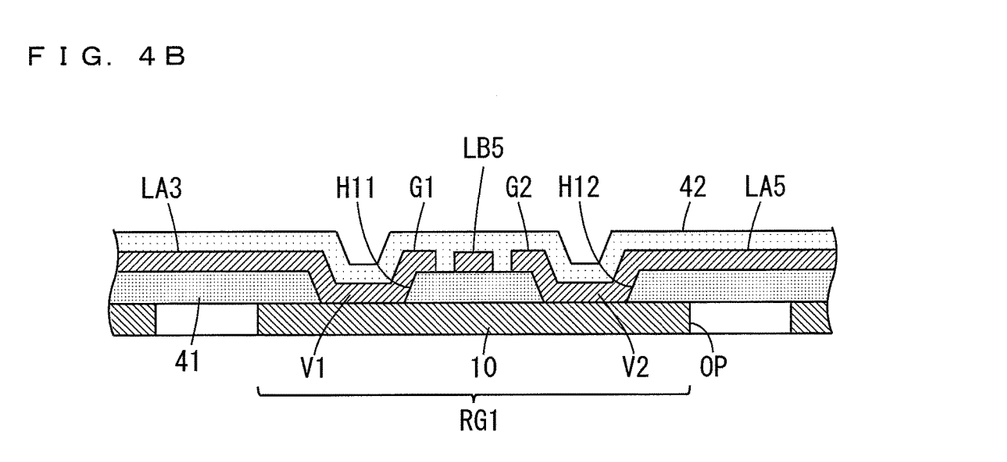

FIGS. 4A and 4B are diagrams showing the details of the intersection region CN1 of FIG. 2. FIG. 4A shows a plan view of the intersection region CN1, and FIG. 4B shows a cross sectional view taken along a line D-D of FIG. 4A. Note that, the intersection region CN2 has the same configuration as the intersection region CN1.

As shown in FIGS. 4A and 4B, an annular opening OP is formed in the suspension body 10. Thus, an island-shaped region RG1 electrically separated from other regions of the suspension body 10 is formed. The line LB5 of the write wiring trace W2 is arranged to extend through the region RG1 of the suspension body 10, and the end of the line LA3 and the end of the line LA5 of the write wiring pattern W1 are arranged on both sides of the line LB5.

Circular connection portions G1, G2 are provided at the end of the line LA3 and the end of the line LA5, respectively.

Further, through holes H11, H12 are formed in portions of the base insulating layer 41 below the connection portions G1, G2, respectively. Each of the through holes H11, H12 is formed in a tapered shape such that the diameter thereof is gradually reduced as approaching a lower surface from an upper surface of the base insulating layer 41.

The connection portion G1 comes into contact with the region RG1 of the suspension body 10 within the through hole H11, and the connection portion G2 comes into contact with the region RG1 of the suspension body 10 within the through hole H12. A via V1 is formed of a portion of the connection portion G1 within the through hole H11, and a via V2 is formed of a portion of the connection portion G2 within the through hole H12. This causes the lines LA3, LA5 to be electrically connected to each other through the region RG1 of the suspension body 10.

The diameter of the connection portion G1 is preferably larger than the width of the line LA3, and the diameter of the connection portion G2 is preferably larger than the width of the line LA5. Further, the diameter of the through hole H11 of the base insulating layer 41 is preferably larger than the width of the line LA3, and the diameter of the through hole H12 is preferably larger than the width of the line LA5. Thus, the electrical connection between the lines LA3 and LA5 is sufficiently ensured.

The shape of each of the connection portions G1, G2 is not limited to circular. Another shape such as elliptical, triangular, quadrangular or a shape of a sector may be employed. The transverse cross sectional shape of each of the through holes H11, H12 may be another shape such as elliptical, triangular, quadrangular or a shape of a sector.

In this manner, in the present embodiment, the line LA2 and the line LA3 are electrically connected through the vias in the intersection region CN1. Further, the line LB3 and the line LB5 are electrically connected through the vias in the intersection region CN2.

Thus, the lines LA4, LB5, LA3, LB4 can be arranged to line up in this order with the write wiring trace W1 and the write wiring trace W2 not interfering each other. As a result, characteristic impedance of the write wiring traces W1, W2 can be reduced.

Figure 5:
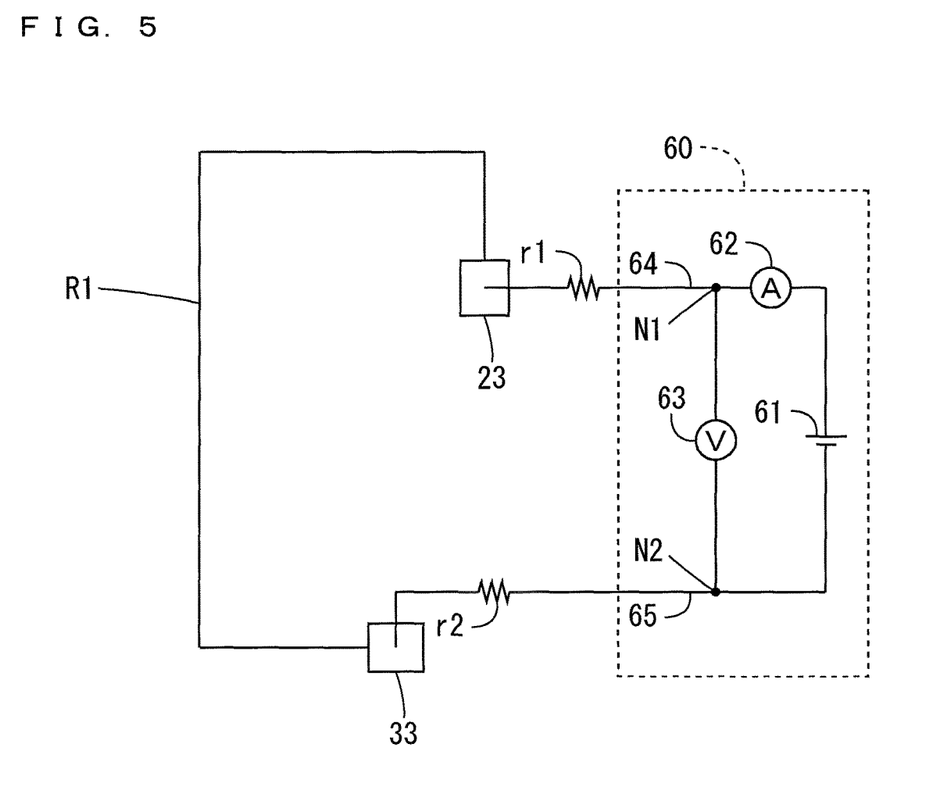
FIG. 5 is a circuit diagram showing a connection of a conductivity tester when a normal conductivity inspection is performed.

(3) Conductivity Inspection Between Electrode Pads
(a) Normal Conductivity Inspection Method In the manufacturing step of the suspension board 1, the conductivity inspection for each of an area between the electrode pads 21 and 31, an area between the electrode pads 22 and 32, an area between the electrode pads 23 and 33, and an area between the electrode pads 24 and 34 is performed using a conductivity tester. FIG. 5 is a circuit diagram showing a connection of the conductivity tester when a normal conductivity inspection is performed. As shown in FIG. 5, the normal conductivity tester 60 includes a power source 61, a current measurer 62, a voltage measurer 63 and two measurement probes (probe pins) 64, 65.

One terminal of the power source 61 is connected to a node N1 through the current measurer 62, and the other terminal of the power source 61 is connected to a node N2. The voltage measurer 63 is connected between the nodes N1 and N2. The measurement probes 64, 65 are connected to the nodes N1, N2, respectively.

The measurement probes 64, 65 are brought into contact with the electrode pads 23, 33, respectively. In this case, contact resistance r1 occurs between the measurement probe 64 and the electrode pad 23, and contact resistance r2 occurs between the measurement probe 65 and the electrode pad 33. In this state, a current flows in the read wiring trace R1 from the power source 61 through the measurement probes 64, 65.

Here, a value of the current flowing in the read wiring trace R1 is measured by the current measurer 62. Further, a value of the voltage between the measurement probes 64 and 65 is measured by the voltage measurer 63. In the connection of FIG. 5, the value of the voltage between the measurement probes 64 and 65 is a sum of a value of the voltage between the electrode pads 23 and 33, a value of the voltage at both ends of the contact resistance r1 and a value of the voltage at both ends of the contact resistance r2.

A resistance value between the measurement probes 64 and 65 is calculated based on the value of the current and the value of the voltage measured by the current measurer 62 and the voltage measurer 63. The resistance value between the measurement probes 64 and 65 is a sum of a resistance value of the read wiring trace R1 and a value of the contact resistance r1 and a value of the contact resistance r2.

In the present embodiment, the read wiring trace R1 does not include the branched line or the via. Therefore, when the calculated resistance value between the measurement probes 64 and 65 is sufficiently small, it can be determined that the area between the electrode pads 23 and 33 is rendered conductive. In this case, the read wiring trace R1 is determined to be normal.

Further, a similar conductivity inspection for the area between the electrode pads 24 and 34 is also performed. When the calculated resistance value between the measurement probes 64 and 65 is sufficiently small, it can be determined that the area between the electrode pads 24 and 34 is rendered conductive. In this case, the write wiring trace R2 is determined to be normal.

On the other hand, the write wiring trace W1 includes the vias V1, V2 (FIG. 4B) and the branched lines LA3, LA4 (FIG. 2). Therefore, even when the area between the electrode pads 21 and 31 is rendered conductive, there may be an abnormality in the write wiring trace W1. Similarly, even when the area between the electrode pads 22 and 32 is rendered conductive, there may be an abnormality in the write wiring trace W2.

Figure 6:
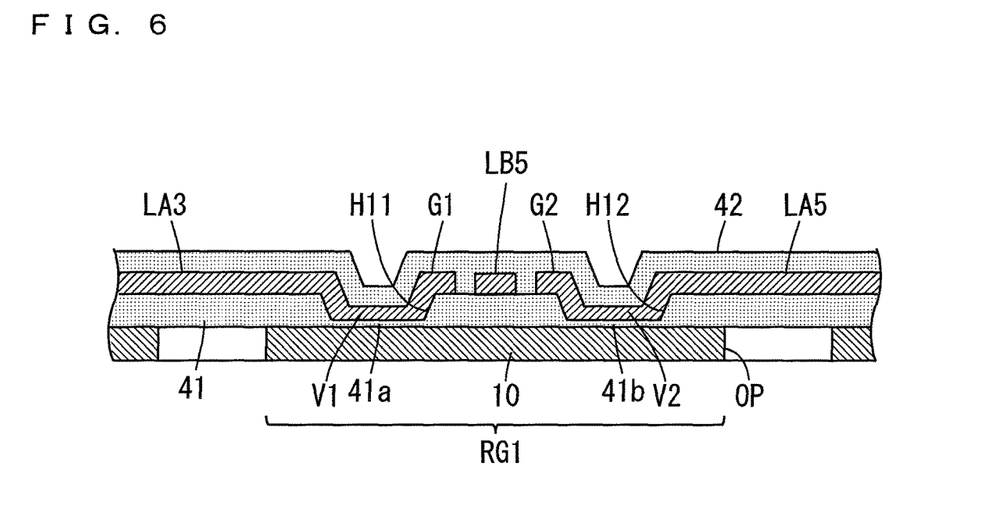
FIG. 6 is a cross sectional view of a suspension board when there are abnormalities in vias.

FIG. 6 is a cross sectional view of the suspension board 1 when there are abnormalities in the vias V1, V2. FIG. 6 is equivalent to a cross sectional view taken along the line D-D of FIG. 4A. As shown in FIG. 6, in this suspension board 1, a foreign object 41a remains between the via V1 and the suspension body 10, and a foreign object 41 b remains between the via V2 and the suspension body 10. In this case, a resistance value of the write wiring trace W1 slightly increases.

Even when the via V1 is slightly detached from the suspension body, or even when the via V2 is slightly detached from the suspension body, the resistance value of the write wiring trace W1 slightly increases. Alternatively, even when any one of the line LA3 and the line L4 is disconnected, the resistance value of the write wiring trace W1 slightly increases. In these cases, there is an abnormality in the write wiring trace W1.

As described above, however, the resistance value between the measurement probes 64 and 65 calculated by the conductivity tester 60 includes the values of the contact resistance r1, r2. Further, the values of the contact resistance r1, r2 have a similar degree of resistance to the write wiring trace W1. Further, the values of the contact resistance r1, r2 slightly change every time the measurement probes 64, 65 are brought into contact with the electrode pads 21, 31, respectively.

Therefore, the normal conductivity tester 60 cannot detect a slight change in the resistance value when there are abnormalities in the write wiring traces W1, W2. Therefore, whether the write wiring traces W1, W2 are proper or improper cannot be accurately determined.

(b) Conductivity Inspection Method According to Present Embodiment

Figure 7:
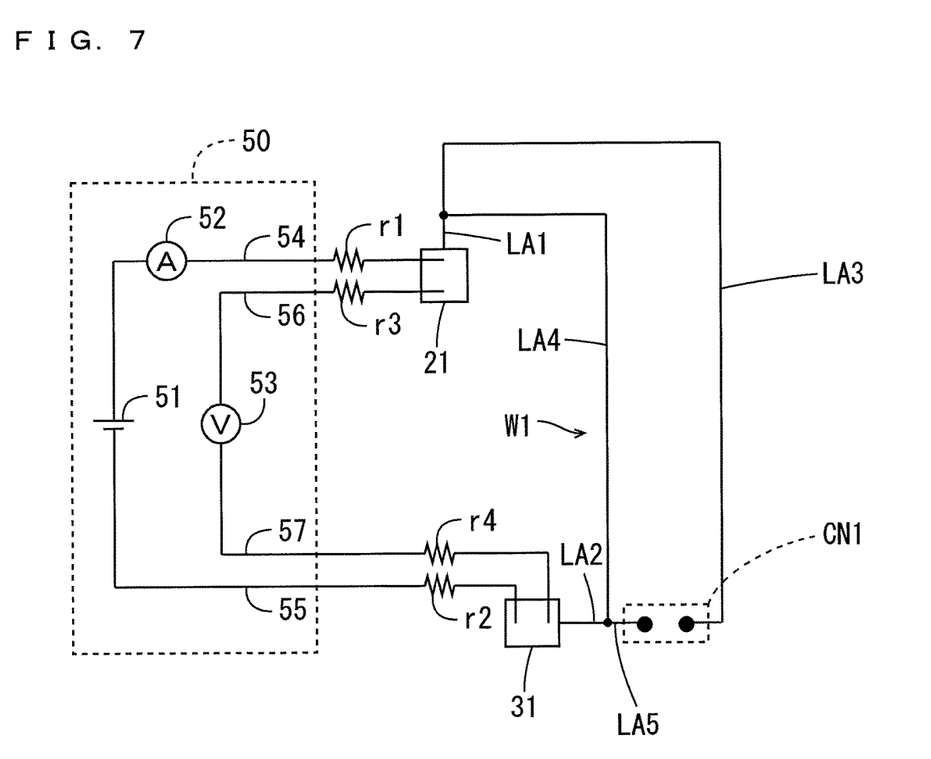
FIG. 7 is a circuit diagram showing a connection of a conductivity tester when a conductivity inspection according to a present embodiment is performed.

FIG. 7 is a circuit diagram showing a connection of a conductivity tester when the conductivity inspection according to the present embodiment is performed. As shown in FIG. 7, the conductivity tester 50 according to the present embodiment includes a power source 51, a current measurer 52, a voltage measurer 53, and four measurement probes (probe pins) 54, 55, 56, 57.

One terminal of the power source 51 is connected to the measurement probe 54 through the current measurer 52, and the other terminal of the power source 51 is connected to the measurement probe 55. One terminal of the voltage measurer 53 is connected to the measurement probe 56, and the other terminal of the voltage measurer 53 is connected to the measurement probe 57.

The measurement probes 54, 55 are brought into contact with the electrode pads 21, 31, respectively, and the measurement probes 56, 57 are brought into contact with the electrode pads 21, 31, respectively. In this case, contact resistance r1 occurs between the measurement probe 54 and the electrode pad 21, and contact resistance r2 occurs between the measurement probe 55 and the electrode pad 31. Further, contact resistance r3 occurs between the measurement probe 56 and the electrode pad 21, and contact resistance r4 occurs between the measurement probe 57 and the electrode pad 31. In this state, a current flows in the write wiring trace W1 from the power source 51 through the measurement probes 54, 55.

Here, a value of the current flowing in the write wiring trace W1 is measured by the current measurer 52. Further, a value of the voltage between the measurement probes 56 and 57 is measured by the voltage measurer 53. A value of internal resistance of the voltage measurer 53 is sufficiently larger than the resistance value of the write wiring trace W1.

Therefore, in the connection of FIG. 7, the current from the power source 51 hardly flows in a path including the contact resistance r3, r4 and the voltage measurer 53. Thus, a value of the voltage between the measurement probes 56 and 57 hardly includes values of the voltage at both ends of the contact resistance r3, r4. That is, the value of the voltage between the measurement probes 56 and 57 is substantially equal to a value of the voltage between the electrode pads 21 and 31.

A resistance value between the measurement probes 54 and 55 is calculated based on the current and the voltage measured by the current measurer 52 and the voltage measurer 53. As described above, because the value of the voltage measured by the voltage measurer 53 hardly includes the values of the voltage at both ends of the contact resistance r3, r4, the resistance value between the measurement probes 54 and 55 hardly includes resistance values of the contact resistance r1 to r4. That is, a resistance value between the measurement probes 56 and 57 is substantially equal to the resistance value of the write wiring trace W1.

In this manner, the resistance between the measurement probes 54 and 55 is not affected by the contact resistance. In this case, the conductivity tester 50 can detect a subtle change in the resistance value of the write wiring trace W1. As one example, in the normal suspension board 1, the resistance value of the write wiring trace W1 is 1.40Ω, for example.

On the other hand, in the suspension board 1 in which an abnormality is in the via V1 or the via V2, the resistance value of the write wiring trace W1 is 1.85Ω, for example.

Further, in the suspension board 1 in which the line LA3 or the line LA4 is disconnected, the resistance value of the write wiring trace W1 is 2.05Ω, for example.

Therefore, a first threshold value is appropriately set between 1.40Ω and 1.85Ω in advance, for example, and a second threshold value is appropriately set between 1.85Ω and 2.05Ω in advance, for example. When the resistance value between the measurement probes 54 and 55 is smaller than the first threshold value, the write wiring trace W1 is determined to be normal. When the resistance value between the measurement probes 54 and 55 is not less than the first threshold value, the write wiring trace W1 is determined to be abnormal.

In a case in which the write wiring trace W1 is determined to be abnormal, when the resistance value between the measurement probes 54 and 55 is smaller than the second threshold value, it is determined that there is an abnormality in the via V1 or the via V2. In a case in which the write wiring trace W1 is determined to be abnormal, when the resistance value between the measurement probes 54 and 55 is not less than the second threshold value, it is determined that the line LA3 or the line LA4 is disconnected.

In this manner, the conductivity tester 50 can detect a subtle change in the resistance value when there is an abnormality in the write wiring trace W1. Thus, whether the write wiring trace W1 is proper or improper can be accurately determined. Further, a type of the abnormality in the write wiring trace W1 can be presumed.

Similarly, the conductivity tester 50 can detect a subtle change in the resistance value when there is an abnormality in the write wiring trace W2. Thus, whether the write wiring trace W2 is proper or improper can be accurately determined. Further, a type of the abnormality in the write wiring trace W2 can be presumed.

(c) Dimensions of Measurement Probes

Figure 8:
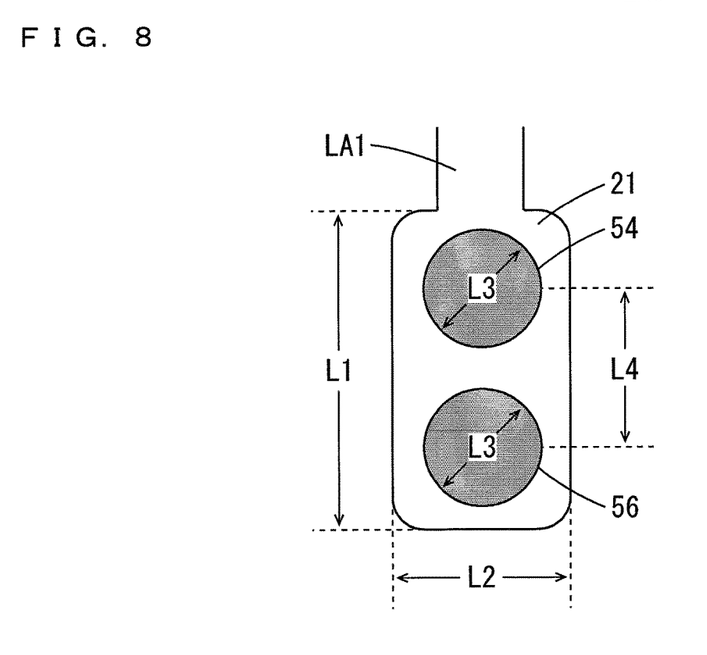
FIG. 8 is a diagram showing dimensions of electrode pads and measurement probes.

FIG. 8 is a diagram showing the dimensions of the electrode pad 21 and the measurement probes 54, 56. As shown in FIG. 8, the electrode pad 21 is substantially rectangular. The length of the electrode pad 21 in a longitudinal direction is L1, and the length of the electrode pad 21 in a width direction is L2. The shape and the dimension of each of the electrode pads 22 to 24 are similar to the shape and the dimension of the electrode pad 21. In FIG. 8, a cross-sectional shape of each of the measurement probes 54, 56 is shown.

The length L1 is preferably not less than 40 μm and not more than 200 μm, and the length L2 is preferably not less than 20 μm and not more than 100 μm. In the present example, the length L1 is 75 μm, and the length L2 is 40 μm.

Tip ends of the measurement probes 54, 56 are needle-shaped. The tip ends of the measurement probes 54, 56 may be hemisphere-shaped or flat. The measurement probes 54, 56 are brought into contact with the electrode pad 21 to be arranged in the longitudinal direction of the electrode pad 21. The diameter of each of the measurement probes 54, 56 is L3, and the distance between the centers of the measurement probes 54 and 56 is L4.

The diameter L3 is preferably not less than 20 μm and not more than 50 μm, and is more preferably not less than 20 μm and not more than 40 μm. The distance L4 is preferably not less than 30 μm and not more than 150 μm, and is more preferably not less than 30 μm and not more than 70 μm. In the present example, the diameter L3 is 30 μm, and the distance L4 is 55 μm. This configuration enables the measurement probes 54, 56 to be easily brought into contact with the electrode pads 21, 22 as being arranged in the longitudinal direction of the electrode pad 21 with the measurement probes 54, 56 not being brought into contact with each other.

On the other hand, the electrode pads 31 to 34 are substantially rectangular, and are formed to be larger than the electrode pads 21 to 24. Therefore, each of the measurement probes 55, 57 may have the similar shape and dimension to each of the measurement probes 54, 56, or may have diameters larger than each of the measurement probes 54, 56 in a contactable range to each of the electrode pads 31 to 34.

(4) Manufacturing Method of Suspension Board

Next, the manufacturing method of the suspension board 1 will be described. In the present example, the plurality of suspension boards 1 are formed on a long-sized support substrate by a roll-to-roll system. FIGS. 9A, 9B, 10A, 10B, 11A and 11B are cross sectional views for illustrating steps of one example of the manufacturing method of the suspension board 1 that is inspected by the conductivity inspection method according to one embodiment of the present invention.

Here, the manufacturing steps of the electrode pads 21, 31 and the intersection region CN1 of FIG. 2 will be described. A cross sectional view taken along the line A-A and a cross sectional view taken along the line B-B of FIG. 2 are shown in the left and right parts of each of the upper diagrams of FIGS. 9A to 11B. A cross sectional view taken along the line C-C of FIG. 2 is shown in the lower diagram of each of FIGS. 9A to 11B.

Figure 9A:
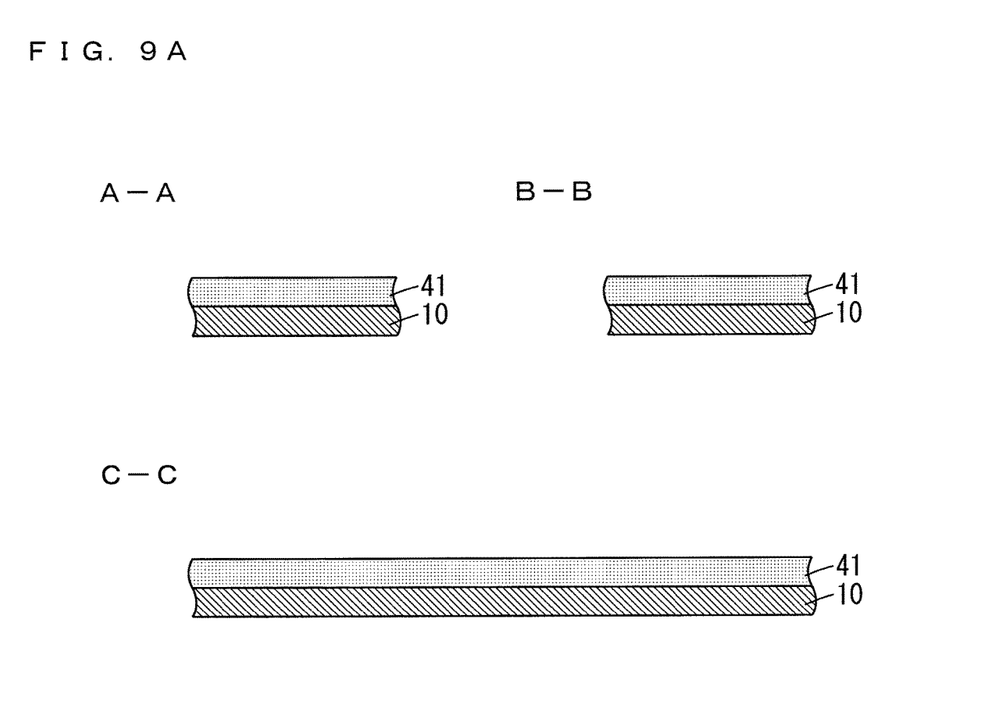
FIGS. 9A and 9B are cross sectional views for illustrating steps of one example of a manufacturing method of the suspension board that is inspected by the conductivity inspection method according to one embodiment of the present invention.

Further, as shown in FIG. 9A, the base insulating layer 41 made of polyimide, for example, is laminated on the suspension body 10 made of stainless, for example, using an adhesive.

The thickness of the suspension body 10 is not less than 5 μm and not more than 50 μm, for example, and is preferably not less than 10 μm and not more than 30 μm. Another metal such as aluminum, an alloy or the like may be used for the suspension body 10 instead of stainless.

The thickness of the base insulating layer 41 is not less than 1 μm and not more than 15 μm, for example, and is preferably not less than 2 μm and not more than 12 μm. Another insulating material such as epoxy resin may be used for the base insulating layer 41 instead of polyimide.

Figure 9B:
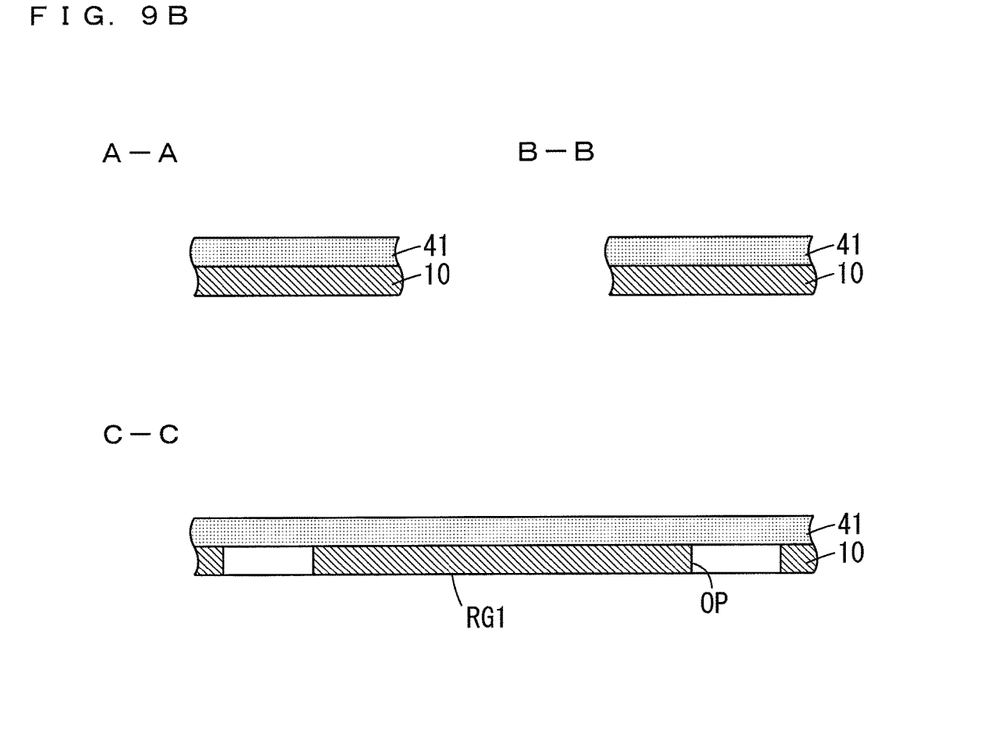

Next, as shown in FIG. 9B, in the intersection region CN1, the annular openings OP are formed in the suspension body 10 by etching and the like. Thus, the region RG1 separated from other regions is formed in the suspension body 10. The area of the region RG1 is not less than 3200 μm$^2$ and not more than 180000 μm$^2$, for example, and is preferably not less than 5000 μm$^2$ and not more than 80000 μm$^2$.

Figure 10A:
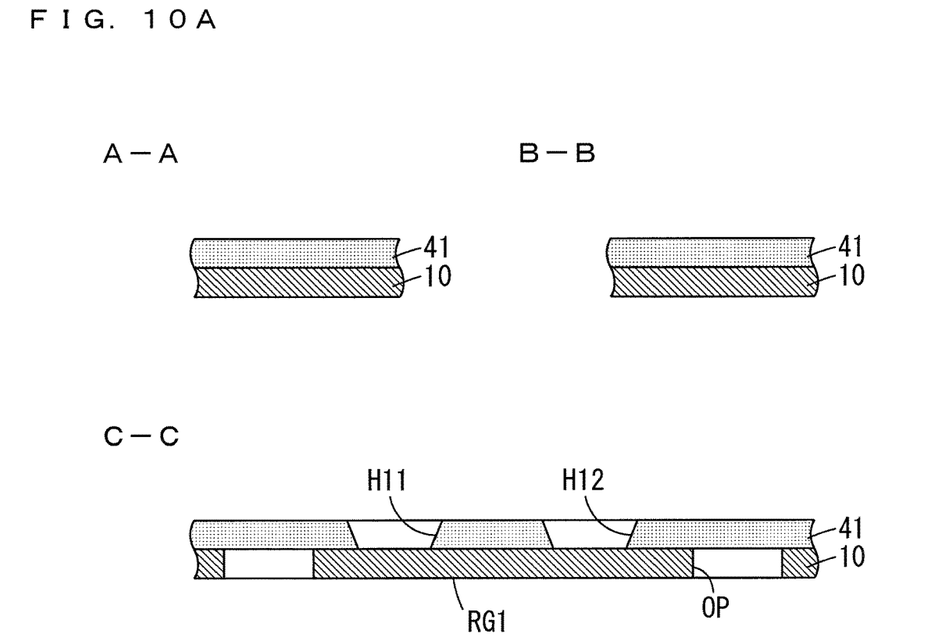
FIGS. 10A and 10B are cross sectional views for illustrating steps of one example of the manufacturing method of the suspension board that is inspected by the conductivity inspection method according to the one embodiment of the present invention.

Next, as shown in FIG. 10A, in the intersection region CN1, the through holes H11, H12 are formed in portions of the base insulating layer 41 above the region RG1 by etching using a laser or wet etching, for example. The diameter of each of the through holes H11, H12 is not less than 20 μm and not more than 200 μm, for example, and is preferably not less than 40 μm and not more than 100 μm.

Figure 10B:
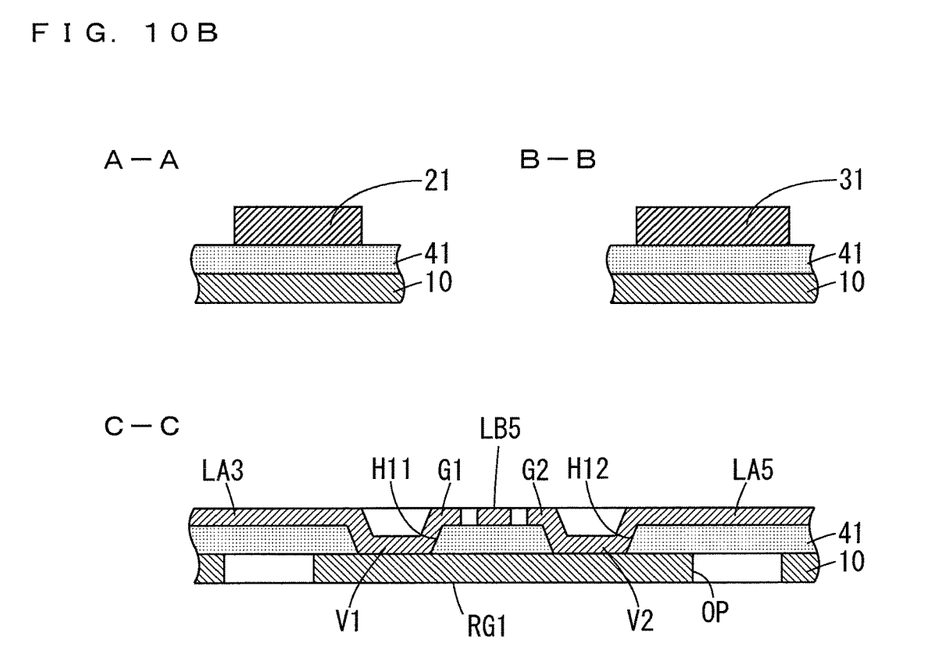

Next, as shown in FIG. 10B, the write wiring traces W1, W2 and the read wiring traces R1, R2 made of copper, for example, are formed on the base insulating layer 41, and the electrode pads 21 to 24, 31 to 34 are formed.

The electrode pads 21 to 24, 31 to 34 are formed by successive laminates of nickel layers and gold plating layers, for example, at both ends of the write wiring traces W1, W2 and the read wiring traces R1, R2. In the present example, the dimensions (the length in the longitudinal direction and the length in the width direction) of each of the electrode pads 31 to 34 is larger than the dimensions (the length in the longitudinal direction and the length in the width direction) of each of the electrode pads 21 to 24.

In the intersection region CN1, the lines LA3, LA5 as the write wiring trace W1, and the line LB5 as the write wiring trace W2 are formed. The connection portions G1, G2 are formed at the end of the line LA3 and the end of the line LA5. The diameter of each of the connection portions G1, G2 is not less than 30 μm and not more than 300 μm, for example, and is preferably not less than 50 μm and not more than 150 μm.

The write wiring traces W1, W2 and the read wiring traces R1, R2 may be formed using a semi-additive method, for example, and may be formed using another method such as a subtractive method. The thickness of each of the write wiring traces W1, W2 and the read wiring traces R1, R2 is not less than 3 μm and not more than 16 μm, for example, and is preferably not less than 6 μm and not more than 13 μm.

Further, the width of each of the lines LA1, LA2, LB1, LB2 of the write wiring traces W1, W2 is not less than 20 μm and not more than 200 μm, for example, and is preferably not less than 30 μm and not more than 100 μm. The width of each of the lines LA3 to LA5, LB3 to LB5 is not less than 10 μm and not more than 150 μm, and is preferably not less than 12 μm and not more than 80 μm.

The material for the write wiring traces W1, W2 and the read wiring traces R1, R2 is not limited to copper. Another metal such as gold (Au) and aluminum or an alloy such as a copper alloy and an aluminum alloy may be used.

Figure 11A:
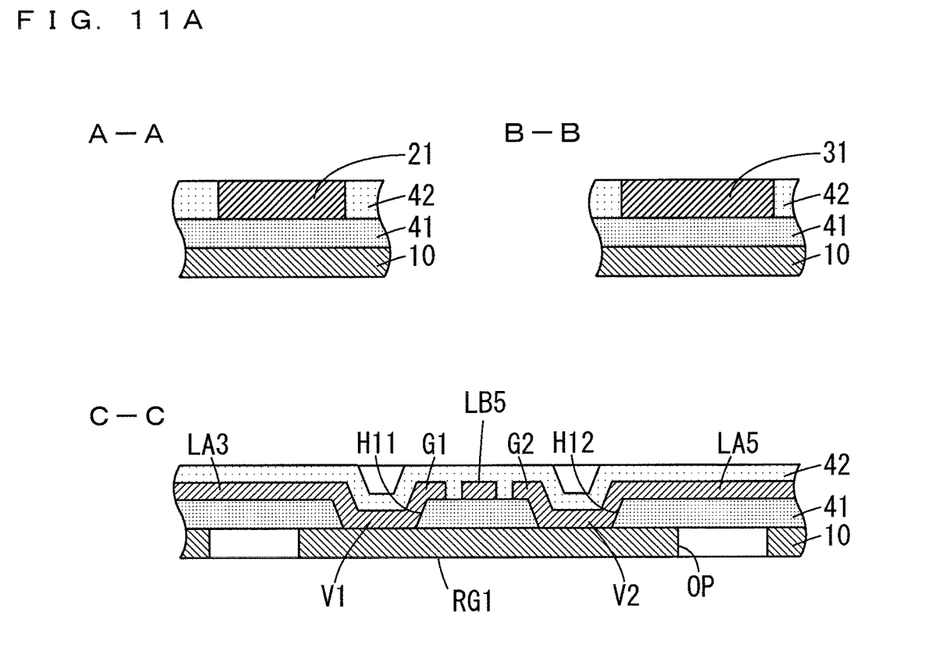
FIGS. 11A and 11B are cross sectional views for illustrating steps of one example of the manufacturing method of the suspension board that is inspected by the conductivity inspection method according to the one embodiment of the present invention.

Next, as shown in FIG. 11A, the cover insulating layer 42 made of polyimide, for example, is formed on the base insulating layer 41 to cover the write wiring traces W1, W2 and the read wiring traces R1, R2. The electrode pads 21 to 24, 31 to 34 are exposed from the cover insulating layer 42.

The thickness of the cover insulating layer 42 on the write wiring traces W1, W2 and the read wiring traces R1, R2 is not less than 4 μm and not more than 26 μm, for example, and is preferably not less than 5 μm and not more than 21 μm. Another insulating material such as epoxy resin may be used for the cover insulating layer 42 instead of polyimide resin. Thus, the suspension board 1 is completed.

Figure 11B:
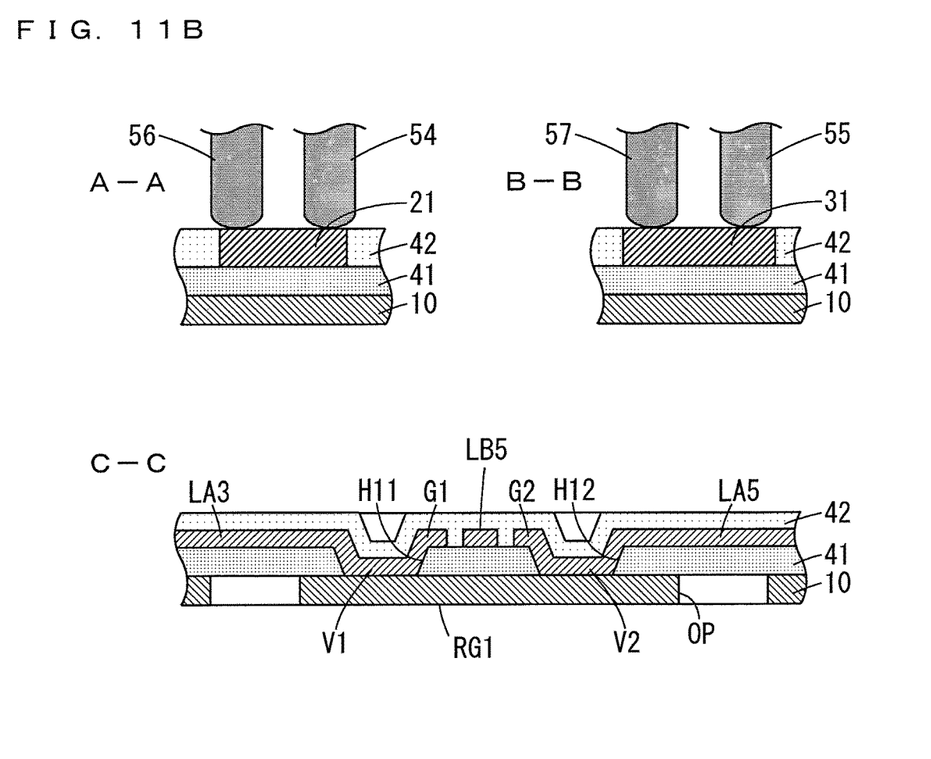

After the suspension board 1 is completed, the conductivity inspection for each of the area between the electrode pads 21 and 31, the area between the electrode pads 22 and 32, the area between the electrode 23 and 33 and the area between the electrode pads 24 and 34 is performed. As shown in FIG. 11B, the conductivity inspection for the area between the electrode pads 21 and 31 is performed by the contact of the measurement probes 54, 56 of the conductivity tester 50 of FIG. 7 with the electrode 21, and the contact of measurement probes 55, 57 with the electrode pad 31.

Similarly, the conductivity inspection for the area between the electrode pads 22 and 32 is performed by the contact of the measurement probes 54, 56 with the electrode pad 22, and the contact of the measurement probes 55, 57 with the electrode pad 32. On the other hand, the conductivity inspection for the area between the electrode pads 23 and 33 is performed by the contact of the measurement probes 64, 65 of the conductivity tester 60 of FIG. 5 with the electrode pads 23, 33, respectively. The conductivity inspection for the area between the electrode pads 24 and 34 is performed by the contact of the measurement probes 64, 65 with the electrode pads 24, 34, respectively.

As a result of these inspections, when the write wiring traces W1, W2 and the read wiring traces R1, R2 are determined to be normal, the suspension board 1 is determined to be normal. The suspension board 1, which is determined to be normal, is separated from the long-sized support substrate.

(5) Effects

The conductivity inspection method according to the present embodiment causes the measurement probes 54, 55 to come into contact with the electrode pads 21, 31, respectively, and the measurement probes 56, 57 to come into contact with the electrode pads 21, 31, respectively. In this state, the current flows in the current path including the electrode pads 21, 31 and the write wiring trace W1 through the measurement probes 54, 55.

The value of the current in the current path is measured, and the value of the voltage between the measurement probes 56 and 57 is measured. In this case, the current does not flow in the measurement probes 56, 57. Therefore, the value of the voltage between the measurement probes 56 and 57 is not affected by the contact resistance r1 to r4. Thus, the value of the voltage between the measurement probes 56 and 57 can be measured with high accuracy and high repeatability.

The conductive state between the electrode pads 21 and 31 is inspected as the resistance value between the measurement probes 56 and 57 based on the measured value of the current and the measured value of the voltage. Here, because the value of the voltage is measured with high accuracy and repeatability, it is possible to distinguish between a resistance value obtained when the write wiring trace W1 is normal, and a resistance value obtained when the write wiring trace W1 is abnormal.

Further, it is possible to distinguish between a resistance value obtained when the vias V1, V2 are normal, and a resistance value obtained when the vias V1, V2 are abnormal. Further, it is possible to distinguish between a resistance value obtained when the lines LA3 to LA5 are normal, and a resistance value obtained when the lines LA3, LA5 or the line LA4 is disconnected.

Further, when the line LA1 is disconnected, when the line LA2 is disconnected, when both of the lines LA3 and LA4 are disconnected or when both of the lines LA4 and LA5 are disconnected, the area between the electrode pads 21 and 31 is not rendered conductive. Therefore, it is possible to distinguish abnormalities in these lines.

As a result, even when the electrode pads 21 and 31 are electrically connected by the plurality of lines LA1 to LA5, an abnormality in conductivity between the electrode pads 21 and 31 can be detected.

(6) Other Embodiments (a) While the conductivity inspection for the area between the electrode pads 23 and 33 and the conductivity inspection for the area between the electrode pads 24 and 34 are performed using the normal conductivity tester 60 in the above-mentioned embodiment, the invention is not limited to this. The conductivity inspection for the area between the electrode pads 23 and 33, and the area between the electrode pads 24 and 34 may be performed using the conductivity tester 50 in the present embodiment.

(b) While the electrode pads 21 to 24, 31 to 34 are substantially rectangular in the above-mentioned embodiment, the invention is not limited to this. The electrode pads 21 to 24, 31 to 34 may be in another shape such as oblong, elliptical or the like. In this case, the maximum dimension of the electrode pads 21 to 24 in one direction is preferably not less than 20 μm and not more than 100 μm, and the maximum dimension of the electrode pads 21 to 24 in another direction perpendicular to the one direction is preferably not less than 40 μm and not more than 200 μm.

(c) While the suspension board 1 includes the vias V1, V2 in the above-mentioned embodiment, the invention is not limited to this. The suspension board 1 does not have to include the vias V1, V2. Alternatively, the suspension board 1 may include an air wiring structure instead of the vias V1, V2.

(d) While the printed circuit board is the suspension board having the suspension body on the other surface of the base insulating layer in the above-mentioned embodiment, the invention is not limited to this. The printed circuit board may be a flexible printed circuit board that does not have the suspension body.

(7) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the measurement probes 54 to 57 are examples of first to fourth measurement probes, respectively, and the vias V1, V2 are examples of a via. The electrode pads 21, 31 are examples of first and second electrode pads, respectively, the base insulating layer 41 is an example of an insulating layer, the region RG1 is an example of a connection layer and the through holes H11, H12 are examples of first and second through holes, respectively. The lines LA1 to LA5 are examples of first to fifth lines, respectively, the suspension body 10 is an example of a metal layer and the suspension board 1 is an example of a printed circuit board.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for the inspection of various printed circuit boards.

We claim:

1. A conductivity inspection method of a printed circuit board in which first and second electrode pads are electrically connected to each other by a plurality of lines, including the steps of:

bringing first and second measurement probes into contact with the first and second electrode pads, respectively, and bringing third and fourth measurement probes into contact with the first and second electrode pads, respectively;

forming a current path such that a current flows in the first and second electrode pads and the plurality of lines through the first and second measurement probes;

measuring a value of the current in the current path;

measuring a value of a voltage between the third and fourth measurement probes; and inspecting conductivity between the first and second electrode pads based on the measured value of the current and the measured value of the voltage, wherein each of diameters of the first and third measurement probes is not less than 20 μm and not more than 50 μm, the plurality of lines being formed to branch from a single line connected to the first electrode pad and to join a single line connected to the second electrode pad, and the step of inspecting the conductivity between the first and second electrode pads includes:

calculating a direct-current resistance value, which is a ratio of a measured value of a direct current to the measured value of the voltage, and determining whether any of the plurality of lines is disconnected based on a comparison between the calculated direct-current resistance value and a predetermined threshold value.

2. The conductivity inspection method of the printed circuit board according to claim 1, wherein the step of bringing the first and second measurement probes into contact with the first and second electrode pads, respectively, and bringing the third and fourth measurement probes into contact with the first and second electrode pads, respectively, includes bringing the first and third measurement probes into contact with the first electrode pad such that a distance between centers of the first and third measurement probes is not less than 30 μm and not more than 150 μm.

3. The conductivity inspection method of the printed circuit board according to claim 1, wherein a via is inserted into at least one of the plurality of lines.

* * * * *